United States Patent
Tseng et al.

(10) Patent No.: US 11,531,067 B2
(45) Date of Patent: Dec. 20, 2022

(54) MOTOR DEMAGNETIZATION DETECTION METHOD AND MOTOR DEMAGNETIZATION DETECTION DEVICE

(71) Applicant: Delta Electronics, Inc., Taoyuan (TW)

(72) Inventors: Shao-Kai Tseng, Taoyuan (TW); Jen-Chih Tseng, Taoyuan (TW); Sheng-Han Wu, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 17/363,502

(22) Filed: Jun. 30, 2021

(65) Prior Publication Data

US 2022/0244313 A1  Aug. 4, 2022

(30) Foreign Application Priority Data

Feb. 3, 2021  (CN) .......................... 202110149162.1

(51) Int. Cl.
*G01R 31/34* (2020.01)
*H02K 11/21* (2016.01)
(Continued)

(52) U.S. Cl.
CPC ....... *G01R 31/343* (2013.01); *G01R 33/1215* (2013.01); *H02K 11/21* (2016.01); *H02P 6/17* (2016.02); *H02P 2207/05* (2013.01)

(58) Field of Classification Search
CPC .......... G01R 31/343; H02K 11/21; H02P 6/17
(Continued)

(56) References Cited

U.S. PATENT DOCUMENTS

2011/0260748 A1\* 10/2011 Lee ........................ H02P 25/024
324/765.01
2012/0146683 A1\* 6/2012 Tanimoto .............. H02P 29/662
324/765.01
(Continued)

OTHER PUBLICATIONS

Bahador et al., Demagnetization Analysis of Axial Flux Permanent Magnet Motor under Three Phase Short Circuit Fault, 4 Power Electronics, Drive Sys. & Tech. Conf. 333 (Feb. 13-14, 2013, Tehran, Iran). (Year: 2013).\*
(Continued)

*Primary Examiner* — Tung X Nguyen
*Assistant Examiner* — Robert P Alejnikov, Jr.
(74) *Attorney, Agent, or Firm* — Muncy, Geissler, Olds & Lowe, P.C.

(57) ABSTRACT

A motor demagnetization detection method includes the following steps. The speed of a motor is calculated according to the rotation angle of the motor. When determining that the motor respectively maintains a first and second steady state according to the speed, the three-phase current values of the motor are received to obtain first and second steady-state data. An equivalent magnetic flux is calculated according to the first and second steady-state data. The motor is repeatedly driven to maintain the first and second steady states, the first and second steady-state data are updated according to the three-phase current values, and the equivalent magnetic flux is again calculated to generate equivalent magnetic fluxes. A magnetic flux change is calculated according to equivalent magnetic fluxes. A demagnetization warning is issued according to a comparison of the magnetic flux change and a demagnetization warning value.

12 Claims, 4 Drawing Sheets

(51) Int. Cl.
*H02P 6/17* (2016.01)
*G01R 33/12* (2006.01)

(58) Field of Classification Search
USPC .................................................. 324/765.01
See application file for complete search history.

(56) References Cited

U.S. PATENT DOCUMENTS

2014/0232306 A1* 8/2014 Yasui .................. H02P 6/00
   318/400.02
2016/0368487 A1* 12/2016 Kim .................... B60L 3/12

OTHER PUBLICATIONS

Skarmoutsos et al., Detecting Partial Demagnetization in AFPM Generators by Monitoring Speed and EMF Induced in a Supplemental Winding, 18 IEEE Trans. Indust. Info. 3295 (May 2022) (Year: 2021).*

* cited by examiner

MOTOR DEMAGNETIZATION DETECTION METHOD AND MOTOR DEMAGNETIZATION DETECTION DEVICE

CROSS REFERENCE TO RELATED APPLICATIONS

This application claims priority of China Patent Application No. 202110149162.1, filed on Feb. 3, 2021, the entirety of which is incorporated by reference herein.

TECHNICAL FIELD

The present invention relates to a motor detection method and a motor detection device, and in particular it relates to a motor demagnetization detection method and a motor demagnetization detection device for detecting a magnetic flux change.

BACKGROUND

In general, a permanent magnet synchronous motor does not require additional excitation current to generate a rotor magnetic field, and has the advantages of high efficiency, low inertia, and high power density. In recent years, permanent magnet synchronous motors have been widely used in industrial applications, such as electric vehicles, robotic arms, elevators, etc.

On the other hand, it is common to add a field weakening control to the control of a permanent magnet synchronous motor, i.e., an appropriate demagnetization current is added to the direct axis (or d axis) of the permanent magnet synchronous motor to extend the operating range of the speed. However, excessive direct axis current may cause permanent demagnetization of the rotor magnet, thereby reducing motor performance. In addition, as the temperature of the rotor increase, the direct axis current that permanently demagnetizes the magnet also decreases, so that the permanent magnet synchronous motor more easily undergoes permanent demagnetization. Therefore, how to effectively detect demagnetization occurring in a motor or electric motor has become an important issue.

SUMMARY

An embodiment of the present invention provides a motor demagnetization detection method and a motor demagnetization detection device, thereby effectively estimating a magnetic flux, decreasing the errors in estimation of the magnetic flux, and increasing the accuracy of demagnetization detection.

An embodiment of the present invention provides a motor demagnetization detection method suitable to detect demagnetization of a motor. The motor demagnetization detection method includes the following steps. An encoder is used to estimate the rotation angle of the motor. A current sensing device is used to estimate the three-phase current value of the motor. The speed of the motor is calculated according to the rotation angle. When determining that the motor maintains a first steady state according to the speed, the three-phase current value is received to obtain and store a first steady-state data. When determining that the motor maintains a second steady state according to the speed, the three-phase current value is received to obtain and store a second steady-state data. An equivalent magnetic flux is calculated and stored according to the first steady-state data and the second steady-state data. The motor is repeatedly driven to maintain the first steady state and the second steady state, the first steady-state data and the second steady-state data are updated according to the three-phase current value, and the equivalent magnetic flux is again calculated and stored to generate a plurality of equivalent magnetic fluxes. A magnetic flux change is calculated according to the equivalent magnetic fluxes. A demagnetization warning is issued according to a comparison result of the magnetic flux change and a demagnetization warning value.

An embodiment of the present invention provides a motor demagnetization detection device suitable to detect demagnetization of a motor. The motor demagnetization detection device includes an encoder, a current sensing device and a controller. The encoder is configured to estimate the rotation angle of the motor. The current sensing device is configured to estimate the three-phase current value of the motor. The controller is coupled to the encoder and the current sensing device. The controller calculates the speed of the motor according to the rotation angle. When the controller determines that the motor maintains a first steady state according to the speed, the controller receives the three-phase current value to obtain and store a first steady-state data. When the controller determines that the motor maintains a second steady state according to the speed, the controller receives the three-phase current value to obtain and store a second steady-state data. The controller calculates and stores an equivalent magnetic flux according to the first steady-state data and the second steady-state data. The motor is repeatedly driven to maintain the first steady state and the second steady state, the controller updates the first steady-state data and the second steady-state data according to the three-phase current value, and again calculates and stores the equivalent magnetic flux to generate a plurality of equivalent magnetic fluxes. The controller calculates a magnetic flux change according to the equivalent magnetic fluxes, and the controller issues a demagnetization warning according to a comparison result of the magnetic flux change and a demagnetization warning value.

According to the motor demagnetization detection method and the motor demagnetization detection device disclosed by the present invention, when determining that the motor maintains the first steady state according to the speed of the motor, the three-phase current value is received to obtain and store the first steady state date. When determining that the motor maintains the second steady state according to the speed of the motor, the three-phase current value is received to obtain and store the second steady-state data. The equivalent magnetic flux is calculated and stored according to the first steady-state data and the second steady-state data. The motor is repeatedly driven to maintain the first steady state and the second steady state, the first steady-state data and the second steady-state data are updated according to the three-phase current value, and the equivalent magnetic flux is again calculated and stored to generate a plurality of equivalent magnetic fluxes. The magnetic flux change is calculated according to the equivalent magnetic fluxes. A demagnetization warning is issued according to the comparison result of the magnetic flux change and the demagnetization warning value. Therefore, the convenience of debug operation and use may be effectively increased. Therefore, it may effectively estimate the magnetic flux and decrease the magnetic flux estimation error generated by non-linear characteristics of the integrated circuit, so as to increase the accuracy of detecting demagnetization, and it may not use the motor parameters (such as the d axis inductance) related to the motor, so as to increase the convenience and accuracy of detection.

BRIEF DESCRIPTION OF DRAWINGS

The present invention can be more fully understood by reading the subsequent detailed description and examples with references made to the accompanying drawings, wherein.

DETAILED DESCRIPTION OF DISCLOSED EMBODIMENTS

In each of the following embodiments, the same reference number represents an element or component that is the same or similar.

Figure 1:
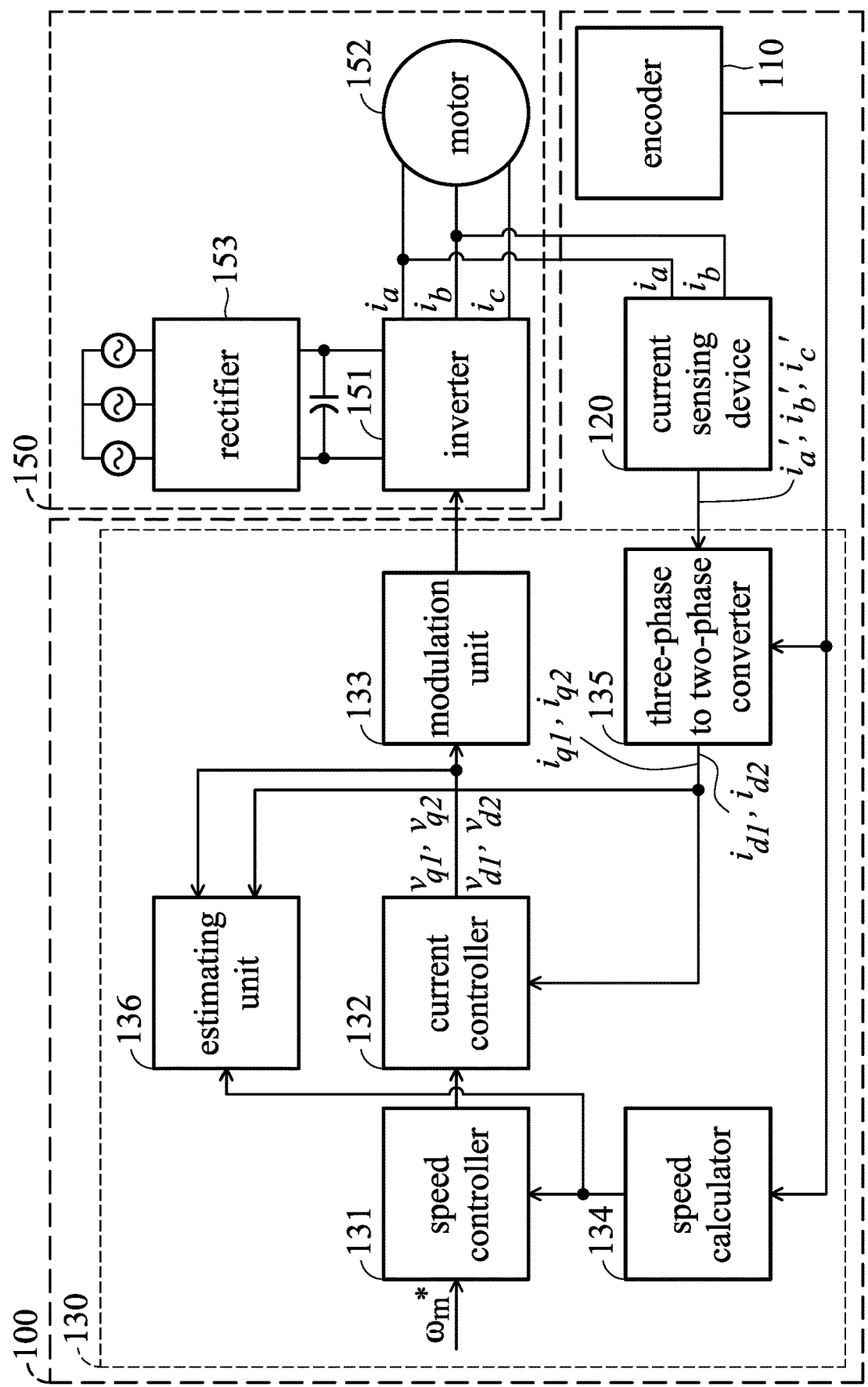
FIG. 1 is a schematic view of a motor demagnetization detection device according an embodiment of the present invention.

FIG. 1 is a schematic view of a motor demagnetization detection device according an embodiment of the present invention. In the embodiment, the motor demagnetization detection device 100 is suitable to detect demagnetization of a motor device 150, wherein the motor 150 may include an inverter 151 and a motor 152. The inverter 151 may output a three-phase current value $i_a$, $i_b$ and $i_c$ according to a control command to drive the motor 152, so that the motor 152 operates. In the embodiment, the motor demagnetization detection device 100 may first receive a speed command, and generate the control command to the inverter 151 according to the speed command. In some embodiments, the motor 152 is, for example, a permanent magnet synchronous motor, and the motor 152 may be applied to elevators, electric vehicles, robotic arms, etc., but the embodiment of the present invention is not limited thereto. Furthermore, the motor device 150 further include a rectifier 153. The rectifier 153 is coupled to the inverter 151, and provide a rectified voltage to the inverter 151. In addition, the rectifier 153 is, for example, a full bridge rectifier, but the embodiment of the present invention is not limited thereto.

Please refer to FIG. 1. The motor demagnetization detection device 100 may include an encoder 110, a current sensing device 120 and a controller 130.

The encoder 110 estimates the rotation angle of the motor device 150 (such as the motor 152) to output a motor position signal. In the embodiment, the encoder 110 may be a position sensor.

The current sensing device 120 is configured to estimate the three-phase current value of the motor device 150 (such as the motor 152). Furthermore, the current sensing device 120 is coupled to an output terminal of the inverter 151, and estimates the three-phase current value $i_a$, $i_b$ and $i_c$ output by the inverter 151 to generate a current detection value (such as $i_a'$, $i_b'$ and $i_c'$) of the three-phase current value $i_a$, $i_b$ and $i_c$.

Figure 2:
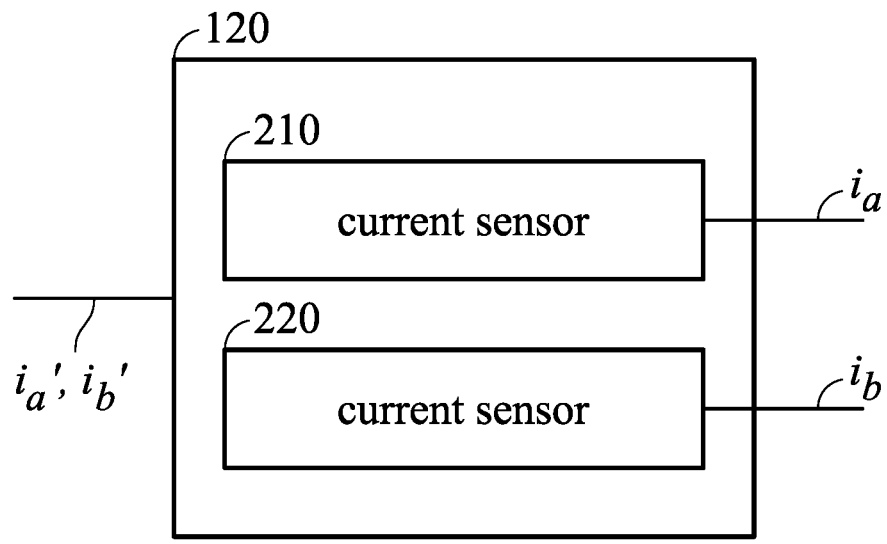
FIG. 2 is a schematic view of a current sensing device according an embodiment of the present invention.
Figure 3:
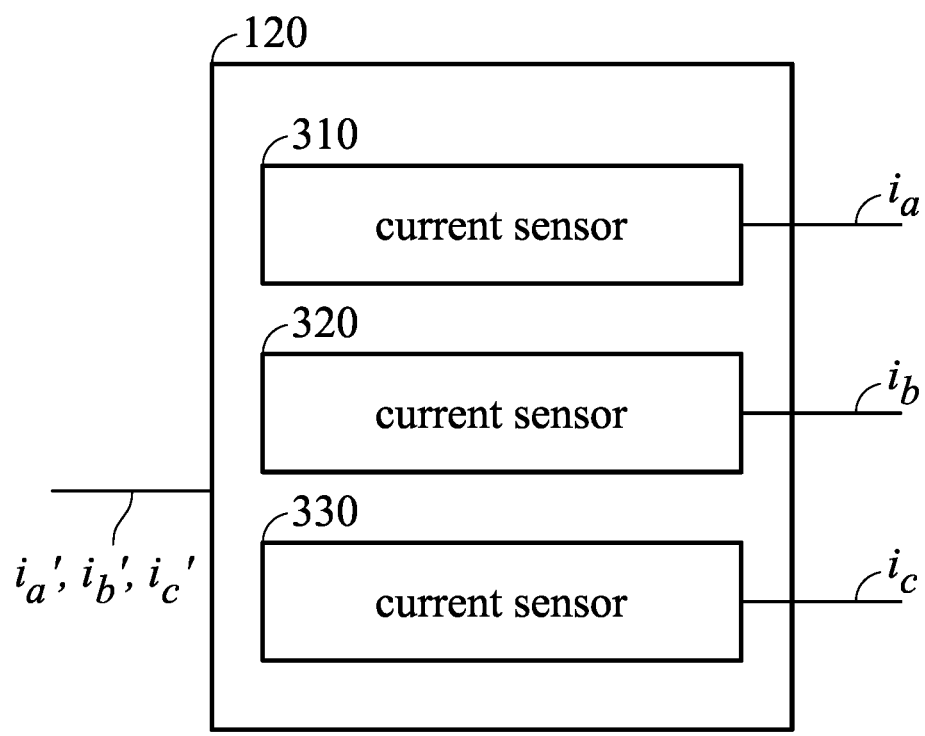
FIG. 3 is a schematic view of a current sensing device according another embodiment of the present invention.

In some embodiments, the current sensing device 120 may include two current sensors 210 and 220, as shown in FIG. 2. The current sensors 210 and 220 are configured to estimate a first phase current (such as $i_a$) and a second phase current (such as $i_b$) of the three-phase current value $i_a$, $i_b$ and $i_c$ output by the inverter 151 to generate the corresponding current detection value (such as $i_a'$ and $i_b'$). The controller 130 may calculates the detection current value (such as $i_c'$) corresponding to the third phase current (such as $i_c$) of the three-phase current value according to the current detection value (such as $i_a'$) corresponding to the first phase current (such as $i_a$) and the current detection value (such as $i_b'$) of the second phase current (such as $i_b$).

In some embodiments, the current sensing device 120 may include three current sensors 310, 320 and 330. The current sensors 310, 320 and 330 are configured to estimate a first phase current (such as $i_a$), a second phase current (such as $i_b$) and a third phase current (such as $i_c$) of the three-phase current value $i_a$, $i_b$ and $i_c$ output by the inverter 151, so that the current sensing device 120 may generate the current detection value (such as $i_a'$, $i_b'$ and $i_c'$) of the three-phase current value $i_a$, $i_b$ and $i_c$. It is particularly noted that the current sensors 210, 220, 310, 320 and 330 may be Hall sensors or current sensing resistors, but the present invention is not limited thereto.

The controller 130 is coupled to the inverter 151, the encoder 110 and the current sensing device 120. The controller 130 may provide the control command to the inverter 151. The controller 130 may receive the motor position signal output by the encoder 110 and the current detection value generated by the current sensing device 120, and the controller 130 may calculate the speed of the motor 152 (the motor device 150) according to the motor position signal (such as the rotation angle). Typically, the controller 130 determines the rotation angle of the motor 152 according to the motor position signal, and differentiates the rotation angle of the motor 152 to obtain the speed of the motor 152.

Then, the controller 130 may determine whether the motor device 150 (such as the motor 152) maintains a first steady state according to the speed of the motor 152 (for example, determining whether the speed of the motor 152 is maintained at a first operating speed for more than a first predetermined time and within a first error range). In the embodiment, the first operating speed is, for example, 1000 rpm, and the first error range is, for example, 5%. That is, the controller 130 may determine whether the speed of the motor 152 is maintained within 5% of the first operating speed, for example, between 950 rpm and 1050 rpm. However, the first operating speed being 1000 rpm and the first error range being 5% is only an exemplary embodiment of the present invention, but the embodiment of the present invention is not limited thereto. In other embodiments, the user may set the first operating speed to 800 rpm, 900 rpm, 1100 rpm, 1200 rpm, etc., and the first error range to 2%, 8%, 10%, 15%, etc., according to the requirements thereof.

When the controller 130 determines that the motor device 150 (such as the motor 152) does not maintain the first steady state (for example, the speed of the motor 152 is not maintained at the first operating speed for more than the first predetermined time and within the first error range), the controller 130 may continue to calculate the speed of the motor 152 according to the motor position signal output by the encoder 110, so as to determine again whether the motor device 150 (such as the motor 152) maintains the first steady state.

When the controller 130 determines that the motor device 150 (such as the motor 152) maintains the first steady state (for example, the speed of the motor 152 is maintained at the first operating speed for more than the first predetermined time and within the first error range), the controller 130 may receive the current detection value (such as $i_a'$, $i_b'$ and $i_c'$) of the three-phase current value $i_a$, $i_b$ and $i_c$ to obtain and store a first steady-state data. In the embodiment, the first steady-state data may include a first direct axis current (such as $i_{d1}$), a first direct axis voltage (such as $v_{d1}$), a first quadrature axis current (such as $i_{q1}$) and a first quadrature axis voltage (such as $v_{q1}$).

Then, the controller 130 may determine whether the motor device 150 (such as the motor 152) maintains a second steady state according to the obtained speed of the motor 152 (for example, determining whether the speed of the motor 152 is maintained at a second operating speed for more than a second predetermined time and within a second error range). In the embodiment, the second operating speed is, for example, 50 rpm, and the second error range is, for example, 10%. That is, the controller 130 may determine whether the speed of the motor 152 is maintained within 10% of the second operating speed, for example, between 45 rpm and 55 rpm. However, the second operating speed being 50 rpm and the second error range being 10% is only an exemplary embodiment of the present invention, but the embodiment of the present invention is not limited thereto. In other embodiments, the user may set the second operating speed to 30 rpm, 40 rpm, 60 rpm, 80 rpm, etc., and the second error range to 5%, 8%, 15%, etc., according to the requirements thereof.

In an embodiment, the first operating speed, the second operating speed, the first error range and the second error range are program setting values of the controller 130. Usually, the second operating speed is lower than the first operating speed, but the present invention is not limited thereto. In other embodiments, the second operating speed is usually zero, for example: the speed of the motor of an elevator system. When the elevator cage reaches the designated floor, the speed of the motor of the elevator system is zero.

When the controller 130 determines that the motor device 150 (such as the motor 152) does not maintain the second steady state (for example, the speed of the motor 152 is not maintained at the second operating speed for more than the second predetermined time and within the second error range), the controller 130 may continue to calculate the speed of the motor 152 according to the motor position signal output by the encoder 110, so as to determine again whether the motor device 150 (such as the motor 152) maintains the second steady state.

When the controller 130 determines that the motor device 150 (such as the motor 152) maintains the second steady state (for example, the speed of the motor 152 is maintained at the second operating speed for more than the second predetermined time and within the second error range), the controller 130 may receive the current detection value (such as $i_a'$, $i_b'$ and $i_c'$) of the three-phase current value $i_a$, $i_b$ and $i_c$, to obtain and store a second steady-state data. In the embodiment, the second steady-state data may include a second direct axis current (such as $i_{d2}$), a second direct axis voltage (such as $v_{d2}$), a second quadrature axis current (such as $i_{q2}$) and a second quadrature axis voltage (such as $v_{q2}$).

After the controller 130 obtain the first steady-state data and the second steady-state data, the controller 130 may obtain and store an equivalent magnetic flux according to the first steady-state data and the second steady-state data.

In the embodiment, the direct axis-quadrature axis (d-q axis) voltage equation of the motor 152 may be expressed as equation (1):

$$\begin{bmatrix} v_d \\ v_q \end{bmatrix} = r_s \begin{bmatrix} i_d \\ i_q \end{bmatrix} + \begin{bmatrix} L_d & 0 \\ 0 & L_q \end{bmatrix} \frac{d}{dt} \begin{bmatrix} i_d \\ i_q \end{bmatrix} + \omega_e \begin{bmatrix} -L_q i_q \\ L_d i_d + \lambda_m' \end{bmatrix} \quad (1)$$

wherein $v_d$ is the direct axis (d axis) voltage, $v_q$ is a quadrature axis (q axis) voltage, $r_s$ is a stator resistance, $i_d$ is a direct axis current, $i_q$ is a quadrature axis current, $L_d$ is a direct axis inductance, $L_q$ is a quadrature axis inductance, $$\frac{d}{dt}$$

is a differential operator, $\omega_e$ is a motor angular speed of the motor 152 and $\lambda_m'$ is an equivalent magnetic flux.

When the motor 152 operates at a steady state (for example, the speed of the motor 152 is maintained at the operating speed within the error range), equation (1) may be rewritten as equation (2), as shown below:

$$\begin{bmatrix} v_d \\ v_q \end{bmatrix} = r_s \begin{bmatrix} i_d \\ i_q \end{bmatrix} + \omega_e \begin{bmatrix} -L_q i_q \\ L_d i_d + \lambda_m' \end{bmatrix} \quad (2)$$

In addition, under a fixed load and at different speed (such as the first operating speed and the second operating speed) operating points, the quadrature axis voltages (such as the first quadrature axis voltage of the first steady-state data and the second quadrature axis voltage of the second steady-state data) are sampled, equation (3a) and equation (3b) may be obtained from equation (2), as shown below:

$$v_{q1} = r_s i_{q1} + \omega_{e1}(L_d i_{d1} + \lambda_m') \quad (3a)$$

$$v_{q2} = r_s i_{q2} + \omega_{e2}(L_d i_{d2} + \lambda_m') \quad (3b)$$

wherein $v_{q1}$ is the first quadrature axis voltage, $i_{q1}$ is the quadrature axis current, $\omega_{e1}$ is the first operating speed, $i_{d1}$ is the first direct axis current, $v_{q2}$ is the second quadrature axis voltage, $i_{q2}$ is the second quadrature axis current, $\omega_{e2}$ is the second operating speed and $i_{d2}$ is the second direct axis current.

Then, the first quadrature axis voltage $v_{q1}$ and the second quadrature axis voltage $v_{q1}$ obtained at the two speed operating points are subtracted, i.e., equation (3a) and equation (3b) are subtracted, to obtain equation (4), as shown below:

$$v_{q1} - v_{q2} = r_s(i_{q1} - i_{q2}) + \omega_{e1}(L_d i_{d1} + \lambda_m') - \omega_{e2}(L_d i_{d2} + \lambda_m') \quad (4)$$

When the first quadrature axis current $i_{q1} \approx$ the second quadrature axis current $i_{q2}$ and the first direct axis current $i_{d1} \approx$ the second direct axis current $i_{d2}$, equation (4) may be simplified to equation (5), as shown below:

$$v_{q1} - v_{q2} = (\omega_{e1} - \omega_{e2})(L_d i_{d1} + \lambda_m') \quad (5)$$

Then, equation (5) may be rewritten as equation (6), so as to estimate the equivalent magnetic flux.

$$\hat{\lambda}_m = \frac{v_{q1} - v_{q2}}{\omega_{e1} - \omega_{e2}} - L_d i_{d1} \quad (6)$$

wherein $\hat{\lambda}_m'$ is the equivalent magnetic flux. That is, the controller 130 may estimate the equivalent magnetic flux according to equation (6), and store the equivalent magnetic flux.

Furthermore, if the direct axis current (such as the first direct axis current $i_{d1}$) is controlled to zero, equation (6) may be simplified to equation (7), as shown below:

$$\hat{\lambda}_m = \frac{v_{q1} - v_{q2}}{\omega_{e1} - \omega_{e2}} \quad (7)$$

That is, the controller 130 may also estimate the equivalent magnetic flux according to equation (7). It can be seen from equation (7) that equivalent magnetic flux $\hat{\lambda}_m'$ may be calculated from the different operating speeds (such as the first operating speed and the second operating speed) and their corresponding quadrature axis voltages (such as the first quadrature axis voltage and the second quadrature axis voltage), and does not use the motor parameters (such as the direct axis inductance $L_d$) related to the motor 152, thereby increasing the convenience and accuracy of detection.

Therefore, the equivalent magnetic flux corresponding to the motor 152 may be estimated by the controller to effectively determine the operating state of the motor, i.e., determining whether the temperature of the rotor of the motor 152 is too high, or determining whether the motor 152 has a phenomenon with demagnetization. For example, when the equivalent magnetic flux is lower than a predetermined threshold, it indicates that the temperature of the rotor of the motor 152 is too high, or the motor 152 has a phenomenon with demagnetization. Otherwise, when the equivalent magnetic flux is not lower than a predetermined threshold, it indicates that the temperature of the rotor of the motor 152 is not too high, or that the motor 152 does not have a phenomenon with demagnetization.

In some embodiments, the controller 130 may adjust the control command to the inverter 151 according to the motor position signal, the first steady-state data and the second steady-state data, so that the inverter 151 changes the three-phase current value to drive the motor 152. As shown in FIG. 1, the controller 130 may include a speed controller 131, a current controller 132, a modulation unit 133, a speed calculator 134, a three-phase to two-phase converter 135 and an estimating unit 136, but the embodiment of the present invention is not limited thereto.

The speed controller 131 may receive the speed command $\omega_m^*$ and the speed of the motor 152, and generate a current command according to the speed command $\omega_m^*$ and the speed of the motor 152. The current controller 132 is coupled to the speed controller 131, and receives the current command generated by the speed controller 131, the direct axis current (such as the first direct axis current $i_{d1}$ or the second direct axis current $i_{d2}$) and the quadrature axis current (such as the first quadrature axis current $i_{q1}$ or the second quadrature axis current $i_{q1}$) to generate the direct axis voltage (such as the first direct axis voltage $v_{d1}$ or the second direct axis voltage $v_{d2}$) and the quadrature axis voltage (such as the first quadrature axis voltage $v_{q1}$ or the second quadrature axis voltage $v_{q2}$). Furthermore, when the current sensing device 120 senses the three-phase current value $i_a$, $i_b$ and $i_c$, the current sensing device 120 output the current detection value (such as $i_a'$, $i_b'$ and $i_c'$) of the three-phase current value $i_a$, $i_b$ and $i_c$ to the three-phase to two-phase converter 135. The three-phase to two-phase converter 135 converts the current detection value (such as $i_a'$, $i_b'$ and $i_c'$) of the three-phase current value $i_a$, $i_b$ and $i_c$ to the direct axis current (such as the first direct axis current $i_{d1}$ or the second direct axis current $i_{d2}$) and the quadrature axis current (such as the first quadrature axis current $i_{q1}$ or the second quadrature axis current $i_{q1}$).

The modulation unit 133 is coupled to the current controller 132, receives the direct axis voltage (such as the first direct axis voltage $v_{d1}$ or the second direct axis voltage $v_{d2}$) and the quadrature axis voltage (such as the first quadrature axis voltage $v_{q1}$ or the second quadrature axis voltage $v_{q2}$) generated by the current controller 132, performs a three-phase to two-phase conversion and a pulse width modulation for the direct axis voltage and the quadrature axis voltage to generate the control command, and provides the control command to the inverter 151. Then, the inverter 151 may output the three-phase current value $i_a$, $i_b$ and $i_c$ according to the control command generated by the modulation unit 133, so as to drive the motor 152 to operate.

The speed calculator 134 is coupled to the encoder 110, receives the motor position signal output by the encoder 110, and calculates the motor position signal to generate the corresponding speed of the motor 152. The three-phase to two-phase converter 135 is coupled to the current sensing device 120, receives the current detection value (such as $i_a'$, $i_b'$ and $i_c'$) of the three-phase current value $i_a$, $i_b$ and $i_c$ generated by the current sensing device 120, and converts the current detection value (such as $i_a'$, $i_b'$ and $i_c'$) to two-phase direct axis current (such as the first direct axis current $i_{d1}$ or the second direct axis current $i_{d2}$) and quadrature axis current (such as the first quadrature axis current $i_{q1}$ or the second quadrature axis current $i_{q1}$).

The estimating unit 136 is coupled to the current controller 132, the three-phase to two-phase converter 135 and the speed calculator 134. The estimating unit 136 may receive the speed of the motor 152 provided by the speed calculator 134, the first direct axis voltage, the first quadrature axis voltage, the second direct axis voltage and the second quadrature voltage provided by the current controller 132 and the first direct axis current, the first quadrature axis current, the second direct axis current and the second quadrature axis current provided by the three-phase to two-phase converter 135.

The estimating unit 136 may determine whether the motor device 150 (such as the motor 152) maintains the first steady state (for example, determining whether the speed of the motor 152 is maintained at the first operating speed for more than the first predetermined time and within the first error range). If the estimating unit 136 determines that the motor device 150 (such as the motor 152) maintains the first steady state (for example, the speed of the motor 152 is maintained at the first operating speed for more than the first predetermined time and within the first error range), the estimating unit 136 may store the first steady-state data corresponding to the first steady state (for example, the speed of the motor 152 is maintained at the first operating speed).

In addition, the estimating unit 136 may also determine whether the motor device 150 (such as the motor 152) maintains the second steady state (for example, determining whether the speed of the motor 152 is maintained at the second operating speed for more than the second predetermined time and within the second error range). If the estimating unit 136 determine that the motor device 150 (such as the motor 152) maintains the second steady state (for example, the speed of the motor 152 is maintained at the second operating speed for more than the second predetermined time and within the second error range), the estimating unit 136 may store the second steady-state data corresponding to the second steady state (for example, the speed of the motor 152 is maintained at the second operating speed). Then, the estimating unit 136 may obtain and store the equivalent magnetic flux according to the first steady-state data and the second steady-state data.

In some embodiments, the controller 130 may further repeatedly generate the control command to the inverter 151 to repeatedly drive the motor 152 to maintain the first steady state and the second steady state, the controller 130 may update the first steady-state data and the second steady-state data according to the current detection value (such as $i_a'$, $i_b'$ and $i_c'$) of the three-phase current value $i_a$, $i_b$ and $i_c$, and again calculate and store the equivalent magnetic flux to generate a plurality of equivalent magnetic fluxes. In the embodiment, the calculation manner of the above equivalent magnetic fluxes may also be calculated using equation (6) or equation (7).

Then, the controller 130 may calculate magnetic flux change according to the above equivalent magnetic fluxes. In some embodiment, the controller 130 may capture a minimum value and a maximum value from the above equivalent magnetic fluxes. That is, the controller 130 may compare the above equivalent magnetic fluxes to obtain the minimum value and the maximum value. Then, the controller 130 may calculate the magnetic flux change according to the minimum value and the maximum value of the above equivalent magnetic fluxes.

In addition, in some embodiments, the controller 130 captures an initial value and a final value from the above equivalent magnetic fluxes. That is, the controller 130 may sort the equivalent magnetic fluxes to obtain the initial value and the final value. Then, the controller 130 may calculate the magnetic flux change according to the initial value and the final value of the above equivalent magnetic fluxes. In the embodiment, the magnetic flux change may be calculated using equation (8), as shown below:

$$\Delta \hat{\lambda}_m = \left| \frac{\hat{\lambda}_m(k) - \hat{\lambda}_m(k-n)}{\hat{\lambda}_m(k-n)} \right| \qquad (8)$$

wherein $\Delta \hat{\lambda}_m'$ is the magnetic flux change, $\hat{\lambda}_m'(k)$ is the initial value and $\hat{\lambda}_m'(k-n)$ is the final value.

After the controller 130 calculates the magnetic flux change, the controller 130 may issue a demagnetization warning according to a comparison result of the magnetic flux change and a demagnetization warning value, so as to determine whether the motor 152 has a phenomenon with demagnetization. In the embodiment, the demagnetization warning value may be adjusted by the user according to the requirements thereof, such as 5% or 10%, but the embodiment of the present invention is not limited thereto.

For example, the controller 130 may compare the magnetic flux change with the demagnetization warning value, so as to determine whether the magnetic flux change is greater than or equal to the demagnetization warning value (for example, determining whether magnetic flux change is greater than or equal to 5% or 10%) and generate the comparison result. When the comparison result is that the magnetic flux change is less than the demagnetization warning value, the controller 130 does not issue a demagnetization warning. Therefore, the controller 130 may determine that the motor 152 does not have a phenomenon with demagnetization, and the controller 130 may continue the detection operation of the magnetic flux change or end the detection operation. When the comparison result is that the magnetic flux change is greater than or equal to the demagnetization warning value, the controller 130 may issue a demagnetization warning. Therefore, the controller 130 may determine that the motor 152 has a phenomenon with demagnetization, and perform a load reduction operation and issue a demagnetization warning signal. Accordingly, the demagnetization warning signal will let the user know that the motor 152 has a phenomenon with demagnetization, and that repairing or replacing the motor 152 may be required.

In some embodiments, the controller 130 includes a storage unit (not shown), so that the controller 130 may store the calculated equivalent magnetic flux in the storage unit, wherein the storage unit may be a memory, an electrically-erasable programmable read-only memory (EEPROM), etc.

Figure 4:
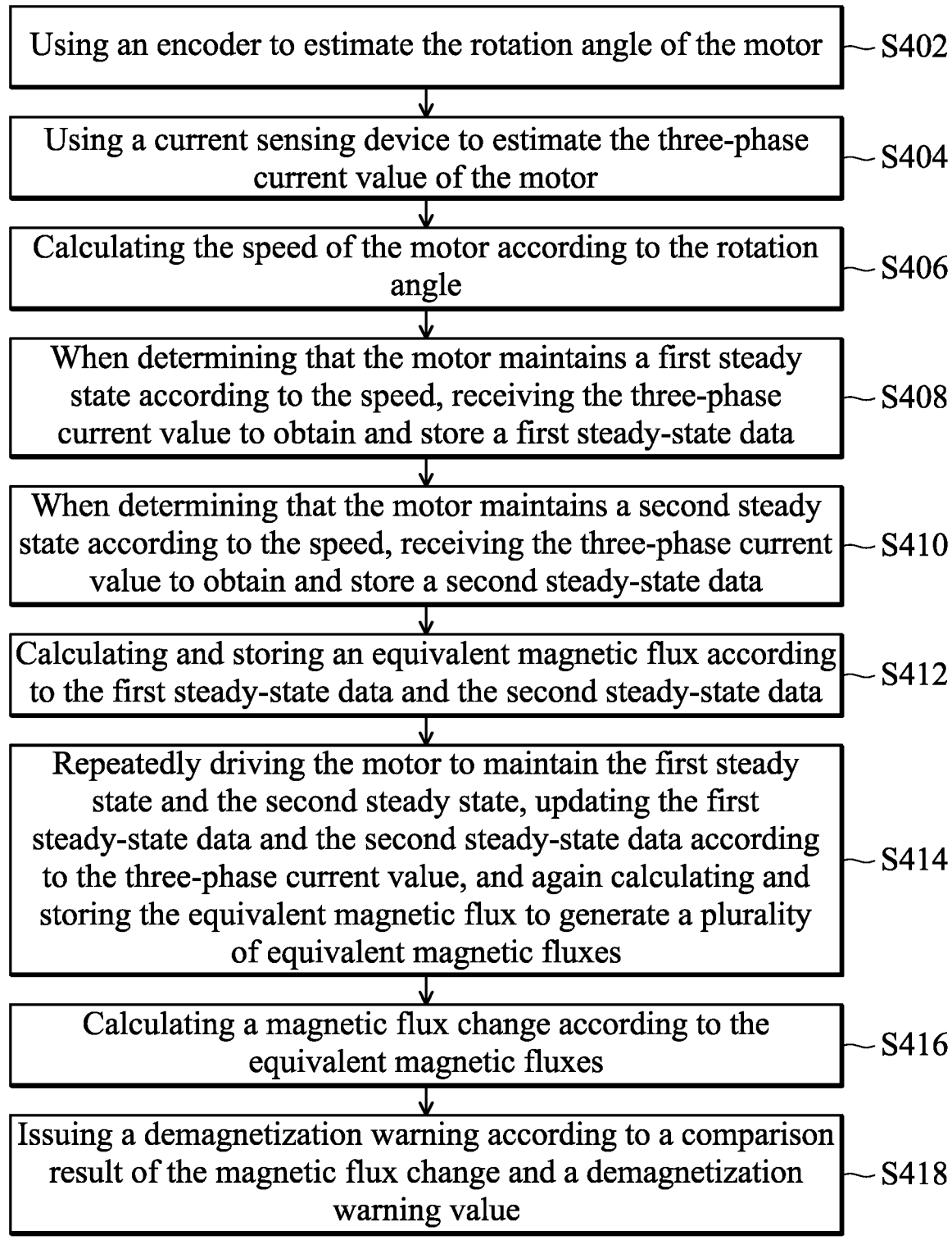
FIG. 4 is a flowchart of a motor demagnetization detection method according an embodiment of the present invention.

According to the above-mentioned description, the embodiment of the present invention additionally provides a motor demagnetization detection method. FIG. 4 is a flowchart of a motor demagnetization detection method according an embodiment of the present invention. In the embodiment, the motor demagnetization detection method is suitable to detect demagnetization of a motor. In step S402, the method involves using an encoder to estimate the rotation angle of the motor.

In step S404, the method involves using a current sensing device to estimate the three-phase current value of the motor. In step S406, the method involves calculating the speed of the motor according to the rotation angle. In step S408, the method involves when determining that the motor maintains a first steady state according to the speed, receiving the three-phase current value to obtain and store a first steady-state data.

In step S410, the method involves when determining that the motor maintains a second steady state according to the speed, receiving the three-phase current value to obtain and store a second steady-state data. In step S412, the method involves calculating and storing an equivalent magnetic flux according to the first steady-state data and the second steady-state data.

In step S414, the method involves repeatedly driving the motor to maintain the first steady state and the second steady state, updating the first steady-state data and the second steady-state data according to the three-phase current value, and again calculating and storing the equivalent magnetic flux to generate a plurality of equivalent magnetic fluxes. In step S416, the method involves calculating a magnetic flux change according to the equivalent magnetic fluxes. In step S418, the method involves issuing a demagnetization warning according to a comparison result of the magnetic flux change and a demagnetization warning value.

In the embodiment, the first steady-state data may include the first direct axis current, the first direct axis voltage, the first quadrature axis current and first quadrature axis voltage. The second steady-state data may include the second direct axis current, the second direct axis voltage, the second quadrature axis current and the second quadrature axis voltage.

Furthermore, in some embodiments, step S416 may include capturing a minimum value and a maximum value of the plurality of equivalent magnetic fluxes, and calculating the magnetic flux change according to the minimum value and the maximum value. In some embodiments, step S416 may include capturing an initial value and a final value of the plurality of equivalent magnetic fluxes, and calculating the magnetic flux change according to the initial value and the final value. In some embodiments, step S418 may include issuing a demagnetization warning when the comparison result is that the magnetic flux change is greater than or equal to the demagnetization warning value; and not issuing the a demagnetization warning when the comparison result is that the magnetic flux change is less than the demagnetization warning value.

It should be noted that the order of the steps of FIG. 4 is only for illustrative purposes, and is not intended to limit the order of the steps of the present invention. The user may change the order of the steps above to meet specific requirements. The flowcharts described above may add additional steps or use fewer steps without departing from the spirit and scope of the present invention.

Figure 5:
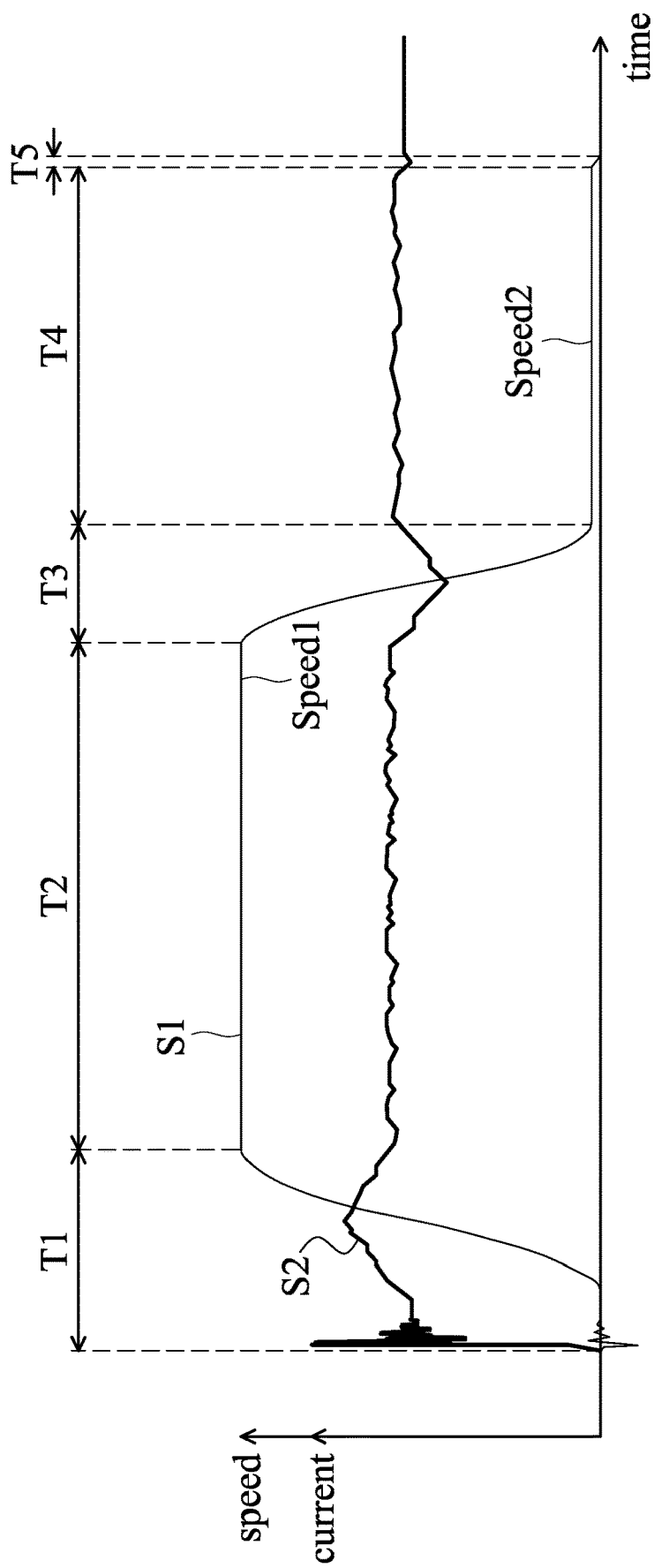
FIG. 5 is a waveform diagram of a speed of a motor and a quadrature axis current when a motor demagnetization detection device drives the motor according an embodiment of the present invention.

FIG. 5 is a waveform diagram of a speed of a motor and a quadrature axis current when a motor demagnetization detection device drives the motor according an embodiment of the present invention. In FIG. 5, a curve S1 indicates the speed of the motor 152, a curve S2 indicates the quadrature current, a reference number Speed1 indicates the first operating speed, a reference number Speed2 indicates the second operating speed, reference numbers T1~T5 indicate time. In addition, in the embodiment, the motor 152 is a motor of an elevator system for example, and the elevator cage rises from the first floor to the fifth floor, for example.

At time T1, when the elevator cage starts to operate from the first floor, a motor brake device releases the motor 152, and the current value of the quadrature axis current S1 increases, so that the motor 152 starts to operate and accelerate. Then, at time T2, when the elevator cage reaches between the second floor and the third floor, the speed of the motor 152 may reach the first operating speed Speed1 and maintain the first operating speed Speed1. That is, the motor device 150 (such as the motor 152) maintains the first steady state. At this time, the controller 130 of the motor demagnetization detection device 100 may obtain and store the first steady-state data. Afterward, at time T3, after the elevator cage reaches the third floor, the current value of the quadrature axis current S1 decrease, so that the motor 152 starts to decelerate. Then, at time T4, the speed of the motor 152 may reach the second operating speed Speed2 and maintain the second operating speed Speed2. That is, the motor device 150 (such as the motor 152) maintains the second steady state. At this time, the controller 130 of the motor demagnetization detection device 100 may obtain and store the second steady-state data. Finally, at time T5, when the elevator cage reaches the fifth floor, the motor brake device may clamp the motor 152, so that the motor 152 stop operating and the speed of the motor 152 is decreased to zero, and then the elevator cage is maintained on the fifth floor.

In summary, according to the motor demagnetization detection method and the motor demagnetization detection device disclosed by the embodiment of the present invention, when determining that the motor maintains the first steady state according to the speed of the motor, the three-phase current value is received to obtain and store the first steady state date. When determining that the motor maintains the second steady state according to the speed of the motor, the three-phase current value is received to obtain and store the second steady-state data. The equivalent magnetic flux is calculated and stored according to the first steady-state data and the second steady-state data. The motor is repeatedly driven to maintain the first steady state and the second steady state, the first steady-state data and the second steady-state data are updated according to the three-phase current value, and the equivalent magnetic flux is again calculated and stored to generate a plurality of equivalent magnetic fluxes. The magnetic flux change is calculated according to the equivalent magnetic fluxes. A demagnetization warning is issued according to the comparison result of the magnetic flux change and the demagnetization warning value. Therefore, it may effectively estimate the magnetic flux and decrease the magnetic flux estimation error generated by non-linear characteristics of the integrated circuit, so as to increase the accuracy of detecting demagnetization, and it may not use the motor parameters (such as the d axis inductance) related to the motor, so as to increase the convenience and accuracy of detection.

While the present invention has been described by way of example and in terms of the preferred embodiments, it should be understood that the present invention is not limited to the disclosed embodiments. On the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A motor demagnetization detection method, suitable to detect demagnetization of a motor, wherein the motor demagnetization detection method comprises:
   using an encoder to estimate a rotation angle of the motor;
   using a current sensing device to estimate a three-phase current value of the motor;
   calculating a speed of the motor according to the rotation angle;
   when determining that the motor maintains a first steady state according to the speed, receiving the three-phase current value to obtain and store a first steady-state data;
   when determining that the motor maintains a second steady state according to the speed, receiving the three-phase current value to obtain and store a second steady-state data;
   calculating and storing an equivalent magnetic flux according to the first steady-state data and the second steady-state data;
   repeatedly driving the motor to maintain the first steady state and the second steady state, updating the first steady-state data and the second steady-state data according to the three-phase current value, and again calculating and storing the equivalent magnetic flux to generate a plurality of equivalent magnetic fluxes;
   calculating a magnetic flux change according to the equivalent magnetic fluxes; and
   issuing a demagnetization warning according to a comparison result of the magnetic flux change and a demagnetization warning value.

2. The motor demagnetization detection method as claimed in claim 1, wherein a minimum value and a maximum value of the plurality of equivalent magnetic fluxes are captured, and the magnetic flux change is calculated according to the minimum value and the maximum value.

3. The motor demagnetization detection method as claimed in claim 1, wherein an initial value and a final value of the plurality of equivalent magnetic fluxes are captured, and the magnetic flux change is calculated according to the initial value and the final value.

4. The motor demagnetization detection method as claimed in claim 1, wherein when the comparison result is that the magnetic flux change is greater than or equal to the demagnetization warning value, the demagnetization warning is issued.

5. The motor demagnetization detection method as claimed in claim 4, wherein when the comparison result is that the magnetic flux change is less than the demagnetization warning value, the demagnetization warning is not issued.

6. A motor demagnetization detection device, suitable to detect demagnetization of a motor, wherein the motor demagnetization detection device comprises:

an encoder, configured to estimate a rotation angle of the motor;
a current sensing device, configured to estimate a three-phase current value of the motor; and
a controller, coupled to the encoder and the current sensing device;
wherein the controller calculates a speed of the motor according to the rotation angle;
wherein when the controller determines that the motor maintains a first steady state according to the speed, the controller receives the three-phase current value to obtain and store a first steady-state data;
wherein when the controller determines that the motor maintains a second steady state according to the speed, the controller receives the three-phase current value to obtain and store a second steady-state data;
wherein the controller calculates and stores an equivalent magnetic flux according to the first steady-state data and the second steady-state data;
wherein the motor is repeatedly driven to maintain the first steady state and the second steady state, the controller updates the first steady-state data and the second steady-state data according to the three-phase current value, and again calculates and stores the equivalent magnetic flux to generate a plurality of equivalent magnetic fluxes;
wherein the controller calculates a magnetic flux change according to the equivalent magnetic fluxes, and the controller issues a demagnetization warning according to a comparison result of the magnetic flux change and a demagnetization warning value.

7. The motor demagnetization detection device as claimed in claim 6, wherein the controller captures a minimum value and a maximum value of the plurality of equivalent magnetic fluxes, and the controller calculates the magnetic flux change according to the minimum value and the maximum value.

8. The motor demagnetization detection device as claimed in claim 6, wherein the controller captures an initial value and a final value of the plurality of equivalent magnetic fluxes, and the controller calculates the magnetic flux change according to the initial value and the final value.

9. The motor demagnetization detection device as claimed in claim 6, wherein when the comparison result is that the magnetic flux change is greater than or equal to the demagnetization warning value, the controller issues the demagnetization warning.

10. The motor demagnetization detection device as claimed in claim 9, wherein when the comparison result is that the magnetic flux change is less than the demagnetization warning value, the controller does not issue the demagnetization warning.

11. The motor demagnetization detection device as claimed in claim 6, wherein the current sensing device comprises two current sensors, and the two current sensors are configured to estimate a first phase current and a second phase current of the three-phase current value, wherein the controller calculates a third phase current of the three-phase current value according to the first phase current and the second phase current.

12. The motor demagnetization detection device as claimed in claim 6, wherein the current sensing device comprises three current sensors, and the three current sensors are configured to estimate a first phase current, a second phase current and a third phase current of the three-phase current value.

* * * * *